(12) United States Patent
Isoya et al.

(10) Patent No.: US 11,467,015 B2
(45) Date of Patent: Oct. 11, 2022

(54) PHYSICAL QUANTITY MEASUREMENT DEVICE

(71) Applicant: Hitachi Astemo, Ltd., Hitachinaka (JP)

(72) Inventors: Yuki Isoya, Hitachinaka (JP); Hiroaki Hoshika, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 42 days.

(21) Appl. No.: 17/287,871

(22) PCT Filed: Nov. 19, 2019

(86) PCT No.: PCT/JP2019/045178
§ 371 (c)(1),
(2) Date: Apr. 22, 2021

(87) PCT Pub. No.: WO2020/110820
PCT Pub. Date: Jun. 4, 2020

(65) Prior Publication Data
US 2021/0396563 A1 Dec. 23, 2021

(30) Foreign Application Priority Data

Nov. 30, 2018 (JP) .............................. JP2018-225913

(51) Int. Cl.
*G01F 1/696* (2006.01)
*G01R 23/00* (2006.01)
*G01M 15/10* (2006.01)

(52) U.S. Cl.
CPC ........... *G01F 1/6965* (2013.01); *G01R 23/00* (2013.01); *G01M 15/102* (2013.01)

(58) Field of Classification Search
CPC ...... H03G 2201/40; H03K 5/003; H03K 5/02; H03K 5/023; H03K 5/026; G01F 1/6965; G01R 23/00
See application file for complete search history.

(56) References Cited

U.S. PATENT DOCUMENTS

| 8,519,719 B2 * | 8/2013 | Coster .................... G01R 27/02 |
| | | 324/615 |
| 11,237,035 B2 * | 2/2022 | Isoya ...................... G01F 1/698 |

(Continued)

FOREIGN PATENT DOCUMENTS

| JP | 58-132672 A | 8/1983 |
| JP | 1-197667 A | 8/1989 |

(Continued)

OTHER PUBLICATIONS

International Search Report (PCT/ISA/210) issued in PCT Application No. PCT/JP2019/045178 dated Mar. 31, 2020 with English translation (four (4) pages).

(Continued)

*Primary Examiner* — Justin N Olamit
(74) *Attorney, Agent, or Firm* — Crowell & Moring LLP

(57) ABSTRACT

Provided is a physical quantity measurement device capable of reducing a frequency analysis error of a gas flow rate as compared with the related art. A physical quantity measurement device 20 includes a flow rate sensor 205 and a signal processing unit 260. The signal processing unit 260 has a buffer 261, an offset adjustment unit 262, a gain calculation unit 263, a correction calculation unit 264, and a frequency analysis unit 265. The buffer 261 stores a flow rate data based on an output signal of the flow rate sensor 205 for a predetermined period. The offset adjustment unit 262 adjusts the zero point of the flow rate waveform. The gain calculation unit 263 calculates a correction gain of the flow rate waveform whose zero point has been adjusted. The correction calculation unit 264 performs the correction by multiplying the flow rate waveform whose zero point has been adjusted by the correction gain. The frequency analysis unit 265 performs a frequency analysis calculation of the corrected flow rate waveform and stores the data obtained by the calculation in the buffer 261. The gain calculation unit (Continued)

263 calculates the correction gain at which the overflow does not occur in the frequency analysis unit 265.

9 Claims, 10 Drawing Sheets

(56) References Cited

U.S. PATENT DOCUMENTS

| | | | |
|---|---|---|---|
| 11,365,699 B2 * | 6/2022 | Suzuki | G01L 13/00 |
| 2008/0092645 A1 * | 4/2008 | Kanke | G01F 1/6845 |
| | | | 73/204.14 |

FOREIGN PATENT DOCUMENTS

| | | |
|---|---|---|
| JP | 5-26921 A | 2/1993 |
| JP | 2011-52964 A | 3/2011 |

OTHER PUBLICATIONS

Japanese-language Written Opinion (PCT/ISA/237) issued in PCT Application No. PCT/JP2019/045178 dated Mar. 31, 2020 (three (3) pages).

\* cited by examiner

PHYSICAL QUANTITY MEASUREMENT DEVICE

TECHNICAL FIELD

The present disclosure relates to a physical quantity measurement device.

BACKGROUND ART

Conventionally, inventions related to a waveform measurement method and a flow rate calculation method of an electronic device that measures a waveform output from a frequency output type air flow meter and calculates a flow rate have been known (see PTL 1 below). The invention described in Patent Citation 1 aims to reduce a flow rate detection error due to a non-linear relationship between a response lag, a cycle, and a flow rate in a transient area (see paragraph 0007 and the like in PTL 1).

In order to achieve this object, the invention described in PTL 1 calculates an average cycle of all waveforms within a predetermined time interval with respect to a frequency output signal of the air flow meter, and performs conversion into a flow rate based on the average cycle. This reduces the flow rate detection error due to the influence of aliasing, and further reduces the response log by performing differential correction in the transient area. In addition, instead of calculating the flow rate by converting the average cycle into the flow rate after the calculation of the average cycle, a signal of the air flow meter is converted into the flow rate for each cycle, and an averaging process is performed in units of the flow rate. This reduces the flow rate detection error due to the non-linearity of the cycle and flow rate (see paragraph 0008 and the like in PTL 1).

According to the invention described in PTL 1, to obtain the flow rate based on the average value of all the output waveforms within the predetermined time interval, it is possible to reduce the flow rate detection error due to the aliasing even during intake pulsation at all frequencies. Since the intake pulsation is a phenomenon caused by the vertical movement of a piston and the resonance of an intake pipe, there is no need to design the intake pipe to avoid a specific frequency for fear of the aliasing. At the same time, this means that it is possible to freely set an air flow rate calculation cycle separately from the intake pulsation cycle (see paragraph 0009 and the like in PTL 1).

CITATION LIST

Patent Literature

PTL 1: JP 2011-052964 A

SUMMARY OF INVENTION

Technical Problem

In the conventional technique, a process of calculating the average cycle of all the waveforms within the predetermined time interval without depending on the increase or decrease in the air flow rate and performing the conversion into the flow rate based on the average cycle is uniformly performed. Under certain conditions, such as when the uniform process is performed, for example, when the amplitude of the air flow rate is small, a frequency analysis error of the air flow rate may increase.

The present disclosure provides a physical quantity measurement device capable of reducing a frequency analysis error of a gas flow rate as compared with the related art.

Solution to Problem

According to one aspect of the present disclosure, there is provided a physical quantity measurement device including a flow rate sensor that outputs a signal corresponding to a flow rate of a gas and a signal processing unit that processes an output signal of the flow rate sensor, in which the signal processing unit includes a buffer that stores flow rate data of the gas based on the output signal for a predetermined period, an offset adjustment unit that adjusts a zero point of a flow rate waveform based on the flow rate data stored in the buffer, a gain calculation unit that calculates a correction gain by which the flow rate waveform whose zero point has been adjusted is multiplied, a correction calculation unit that performs correction by multiplying the flow rate waveform whose zero point has been adjusted by the correction gain, and a frequency analysis unit that performs a frequency analysis calculation of the corrected flow rate waveform and stores the data obtained by the calculation in the buffer, and the gain calculation unit calculates the correction gain that does not cause an overflow in the frequency analysis unit.

Advantageous Effects of Invention

According to one aspect of the present disclosure, it is possible to provide a physical quantity measurement device capable of reducing the frequency analysis error of the gas flow rate.

DESCRIPTION OF EMBODIMENTS

Hereinafter, embodiments of a physical quantity measurement device according to the present disclosure will be described with reference to the drawings.

First Embodiment

Figure 1:
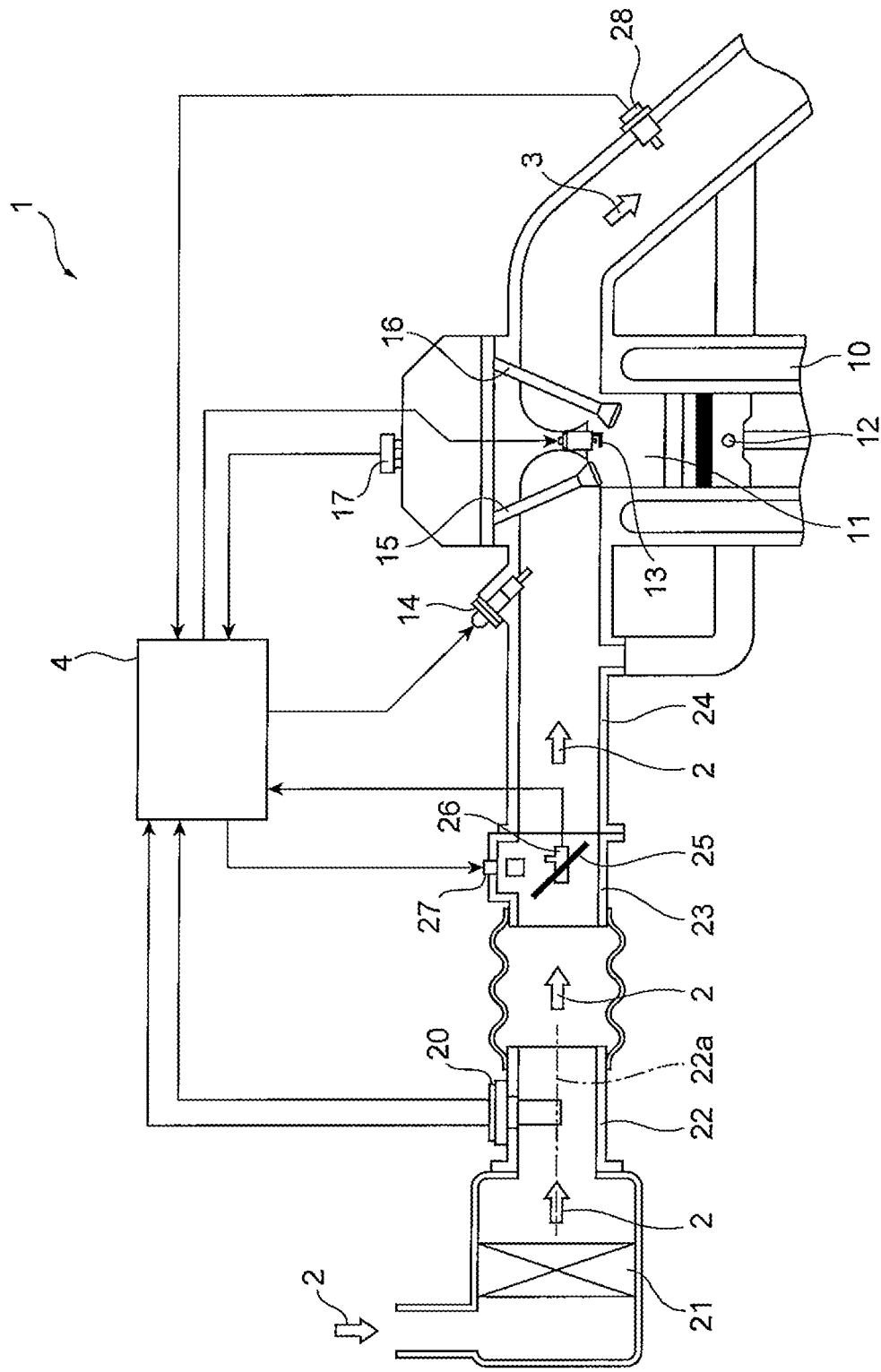
FIG. 1 is a system diagram illustrating an example of an electronic fuel injection type internal combustion engine control system.

FIG. 1 is a system diagram of an electronic fuel injection type internal combustion engine control system 1 using a physical quantity measurement device 20 according to a first embodiment of the present disclosure.

In the internal combustion engine control system 1, intake air is sucked from an air cleaner 21 as a measured gas 2 based on an operation of an internal combustion engine 10 including an engine cylinder 11 and an engine piston 12. The intake air is introduced into a combustion chamber of the engine cylinder 11 via an intake body which is a main passage 22, a throttle body 23, and an intake manifold 24. A physical quantity of the measured gas 2, which is the intake air introduced into the combustion chamber, is measured by the physical quantity measurement device 20. Further, fuel is supplied from a fuel injection valve 14 based on the physical quantity measured by the physical quantity measurement device 20, and is introduced into the combustion chamber together with the intake air in a state of an air-fuel mixture.

Note that in the present embodiment, the fuel injection valve 14 is provided in an intake port of the internal combustion engine 10, the fuel injected into the intake port is mixed with the intake air, and the air-fuel mixture of the fuel and the intake air is introduced into the combustion chamber via the intake valve 15 and burns to generate mechanical energy. The air-fuel mixture introduced into the combustion chamber is in the state in which fuel and air are mixed, and is explosively burned by spark ignition of an ignition plug 13 to generate mechanical energy. The burned gas is introduced into an exhaust pipe from an exhaust valve 16, and is discharged from the exhaust pipe to an outside of a vehicle as exhaust gas 3.

The flow rate of the measured gas 2, which is the intake air introduced into the combustion chamber, is controlled by a throttle valve 25 whose opening degree changes based on an operation of an accelerator pedal. In addition, a fuel supply amount is controlled based on the flow rate of the intake air introduced into the combustion chamber. By controlling the opening degree of the throttle valve 25 to control the flow rate of the intake air introduced into the combustion chamber, the mechanical energy generated by the internal combustion engine 10 can be controlled.

The physical quantity measurement device 20 measures physical quantities such as the flow rate, temperature, humidity, and pressure of the measured gas, which is the intake air taken in through the air cleaner 21 and flowing through the main passage 22. The physical quantity measurement device 20 outputs an electric signal according to the physical quantity of the intake air. An output signal of the physical quantity measurement device 20 is input to a control device 4.

In addition, an output of a throttle angle sensor 26 for measuring the opening degree of the throttle valve 25 is input to the control device 4, and furthermore, in order to measure a position and state of the engine piston 12, the intake valve 15, or the exhaust valve 16 of the internal combustion engine 10 and a rotation speed of the internal combustion engine 10, an output of a rotation angle sensor 17 is input to the control device 4. An output of an oxygen sensor 28 is input to the control device 4 in order to measure a state of a mixing ratio of the amount of fuel and the amount of air from the state of the exhaust gas 3.

The control device 4 calculates a fuel injection amount and an ignition timing based on the physical quantity of the intake air which is the output of the physical quantity measurement device 20 and the rotation speed of the internal combustion engine 10 measured based on the output of the rotation angle sensor 17. Based on these calculation results, the amount of fuel supplied from the fuel injection valve 14 and the ignition timing at which ignition is performed by the ignition plug 13 are controlled. The fuel supply amount or the ignition timing is actually finely controlled based on a temperature measured by the physical quantity measurement device 20, a state of change in the throttle angle, a state of change in the engine speed, and a state of an air-fuel ratio measured by the oxygen sensor 28. Further, the control device 4 controls the amount of air bypassing the throttle valve 25 by an idle air control valve 27 in an idle operation state of the internal combustion engine 10, and controls the rotation speed of the internal combustion engine 10 in the idle operation state.

Any of the fuel supply amount or ignition timing, which is the main control quantity of the internal combustion engine 10, is calculated using the output of the physical quantity measurement device 20 as the main parameter. Therefore, it is important to improve the measurement accuracy of the physical quantity measurement device 20, suppress the change with time, and improve the reliability in order to improve the control accuracy and reliability of the vehicle. In recent years, particularly, there has been a very high demand for fuel efficiency of the vehicle, and a very high demand for exhaust gas purification. In order to meet these demands, it is extremely important to improve the measurement accuracy of the physical quantity of the intake air which is the measured gas 2 measured by the physical quantity measurement device 20. In addition, it is important that the physical quantity measurement device 20 maintains high reliability.

Vehicles equipped with the physical quantity measurement device 20 are used in the environment where the change in temperature or humidity is large. It is preferable that the physical quantity measurement device 20 also considers the response to the change in temperature or humidity in the usage environment and the response to dust, pollutants, or the like. In addition, the physical quantity measurement device 20 is mounted on the intake pipe which is affected by the heat generated from the internal combustion engine 10. For this reason, the heat generated by the internal combustion engine 10 is transmitted to the physical quantity measurement device 20 via the intake pipe which is the main passage 22. Since the physical quantity measurement device 20 measures the flow rate of the measured gas by performing heat transfer with the measured gas, it is important to suppress the influence of heat from the outside as much as possible.

As described below, the physical quantity measurement device 20 mounted on the vehicle simply solves the problems described in the column of the problem to be solved by the invention, and achieves the effects described in the column of the effect of the invention. As will be described below, the physical quantity measurement device 20 fully considers the above-mentioned various problems, solves various problems required as a product, and achieves various effects.

Specific problems to be solved by the physical quantity measurement device 20 or specific effects to be achieved will be described in the description of the following embodiments.

Figure 2:
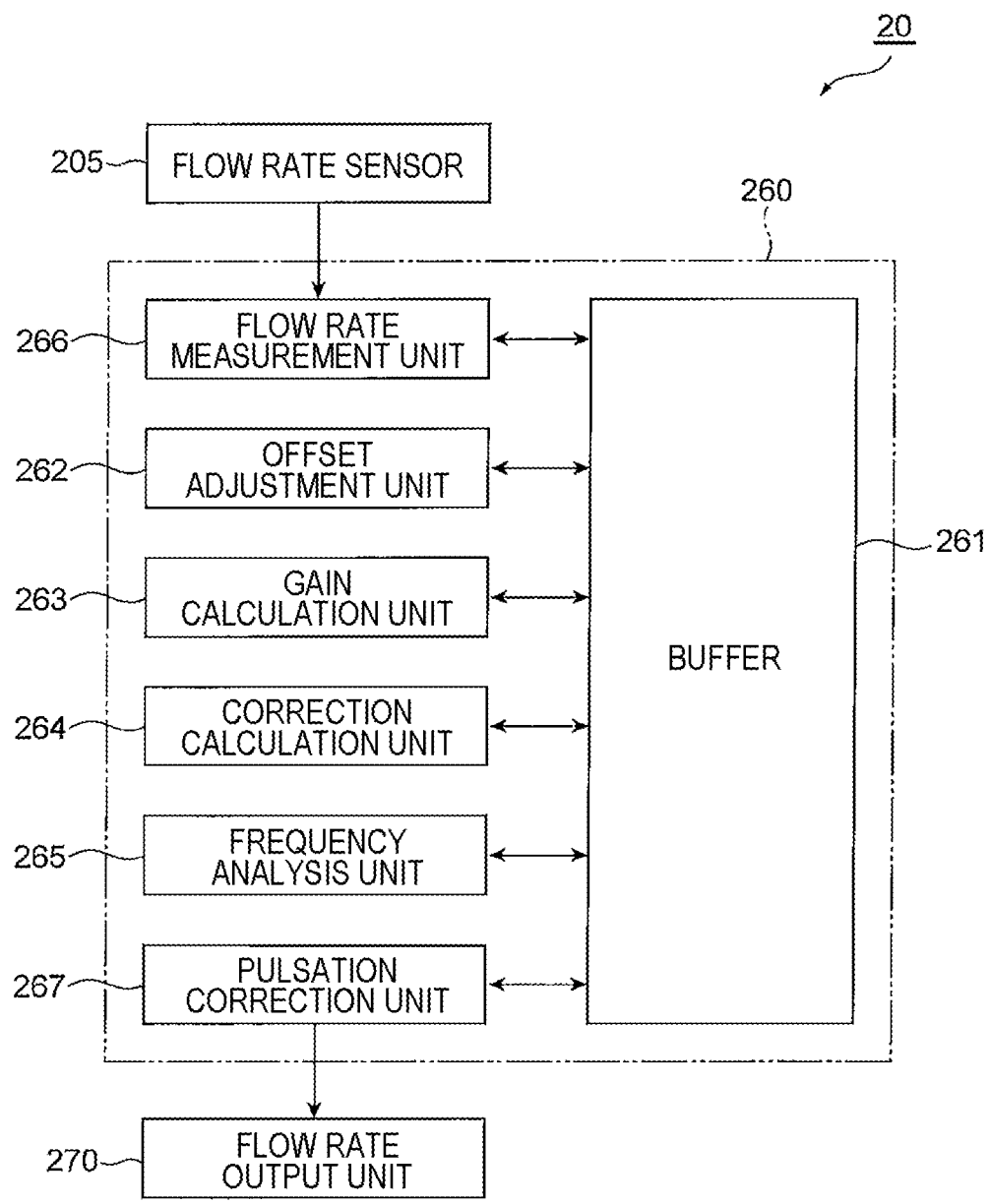
FIG. 2 is a block diagram of the physical quantity measurement device used in the internal combustion engine control system illustrated in FIG. 1.

FIG. 2 is a block diagram illustrating a configuration of the feature part of the physical quantity measurement device 20 illustrated in FIG. 1. Although details will be described later, the physical quantity measurement device 20 of the present embodiment is characterized by the following configuration.

The physical quantity measurement device 20 includes a flow rate sensor 205 that outputs a signal corresponding to the flow rate of the measured gas 2, and a signal processing unit 260 that processes an output signal of the flow rate sensor 205. The signal processing unit 260 includes a buffer 261, an offset adjustment unit 262, a gain calculation unit 263, a correction calculation unit 264, and a frequency analysis unit 265. The buffer 261 stores the flow rate data of the measured gas 2 based on the output signal of the flow rate sensor 205 for a predetermined period. The offset adjustment unit 262 adjusts a zero point of a flow rate waveform based on the flow rate data stored in the buffer 261. The gain calculation unit 263 calculates a correction gain to be multiplied by the flow rate waveform whose zero point has been adjusted. The correction calculation unit 264 performs the correction by multiplying the correction gain by the flow rate waveform whose zero point has been adjusted. The frequency analysis unit 265 performs a frequency analysis calculation of the corrected flow rate waveform and stores the data obtained by the calculation in the buffer 261. Then, the gain calculation unit 263 calculates, as the correction gain, a gain at which the frequency analysis unit 265 does not cause an overflow.

In the example illustrated in FIG. 2, the signal processing unit 260 further includes a flow rate measurement unit 266 and a pulsation correction unit 267. Further, in the example illustrated in FIG. 2, the physical quantity measurement device includes a flow rate output unit 270. The flow rate measurement unit 266 includes, for example, a conversion table that records the relationship between the output signal of the flow rate sensor 205 and the flow rate of the measured gas 2, and converts the output signal of the flow rate sensor 205 into the flow rate data of the measured gas 2.

The pulsation correction unit 267 performs the pulsation correction of the flow rate waveform of the measured gas 2 based on the flow rate data of the measured gas 2 converted by the flow rate measurement unit 266 and the result of the frequency analysis by the frequency analysis unit 265, and inputs the corrected flow rate data of the measured gas 2 to the flow rate output unit 270.

The flow rate output unit 270 outputs the flow rate data of the measured gas 2 after the pulsation correction input from the signal processing unit 260 to the outside of the physical quantity measurement device 20 via an external terminal.

Figure 3:
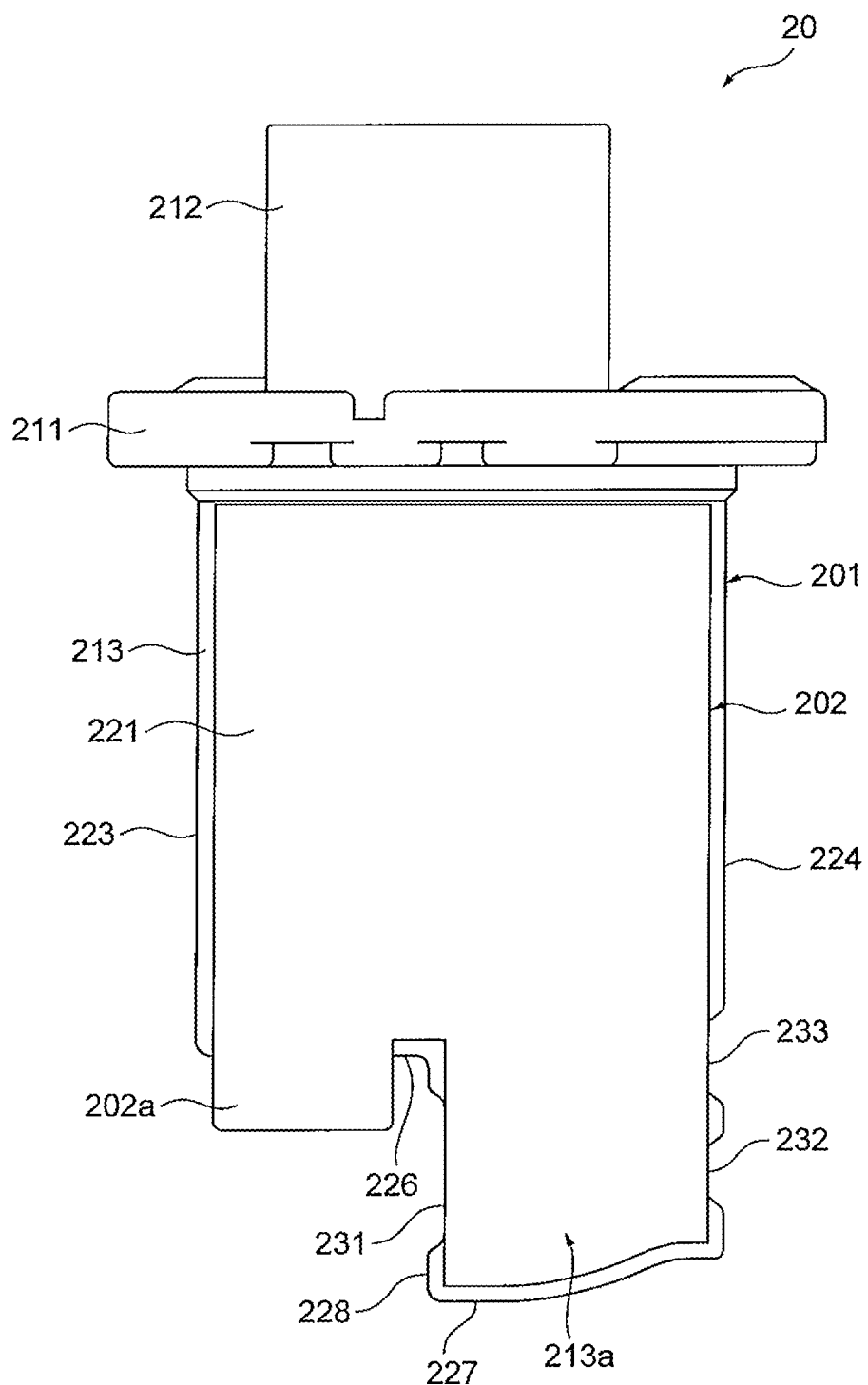
FIG. 3 is a front view of the physical quantity measurement device used in the internal combustion engine control system illustrated in FIG. 1.
Figure 4:
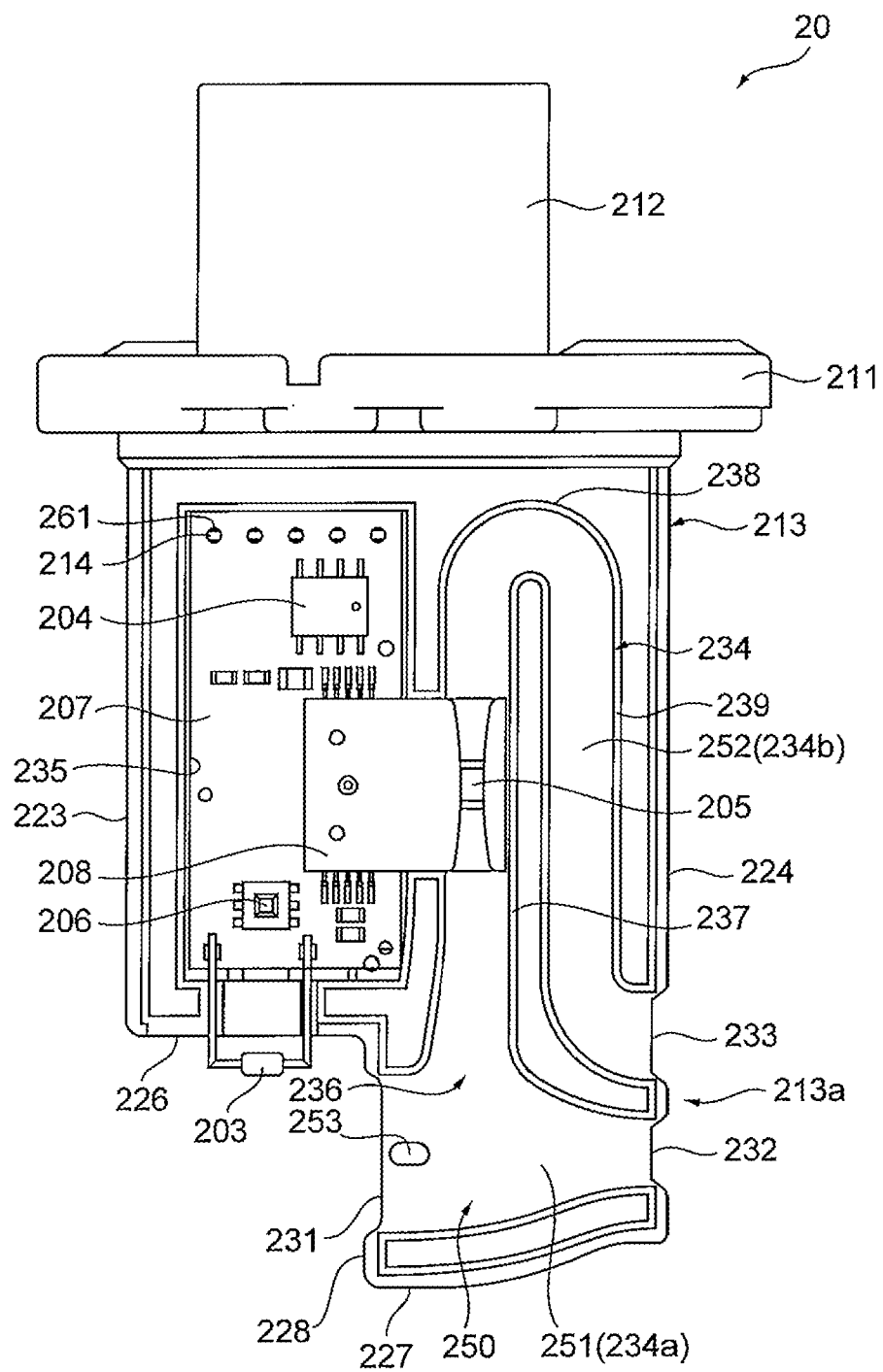
FIG. 4 is a front view of the physical quantity measurement device illustrated in FIG. 3 without a cover.

Hereinafter, the configuration of the physical quantity measurement device 20 of the present embodiment will be described in detail with reference to FIGS. 3 and 4. FIG. 3 is a front view of the physical quantity measurement device 20 illustrated in FIG. 1. FIG. 4 is a front view of the physical quantity measurement device 20 of FIG. 3 without a cover 202. Note that FIG. 4 omits an illustration of a sealing material that seals a circuit board 207.

The physical quantity measurement device 20 is used by being inserted into the main passage 22 from a mounting hole mounted on a passage wall of the main passage 22. The physical quantity measurement device 20 includes a housing 201 and the cover 202 attached to the housing 201. The housing 201 is formed by injection molding a synthetic resin material, and the cover 202 is constituted by a plate-like member made of a conductive material such as an aluminum alloy. The cover 202 is formed in the shape of a thin plate and has a wide flat cooling surface.

The housing 201 has a flange 211 fixed to the intake body which is the main passage 22, a connector 212 that protrudes from the flange 211 and is exposed to the outside from the intake body to perform an electrical connection with an external device, and a measurement unit 213 that extends to protrude from the flange 211 toward a center of the main passage 22.

The flange 211 has, for example, a substantially rectangular shape in a plan view, having a predetermined plate thickness, and has through holes provided in corners. The flange 211 is screwed into a screw hole of the main passage 22, for example, by inserting a fixing screw into the through hole provided in the corner, and thus is fixed to the main passage 22.

For example, the connector 212 has four external terminals and a correction terminal provided inside thereof. The external terminals are a terminal for outputting physical quantities such as flow rate or temperature, which are the measurement results of the physical quantity measurement device 20, and a power supply terminal for supplying DC power for operating the physical quantity measurement device 20. The correction terminal is a terminal used to measure the produced physical quantity measurement device 20, obtain correction values for each physical quantity measurement device 20, and store the correction values in a memory inside the physical quantity measurement device 20.

The measurement unit 213 has a thin and long shape extending from the flange 211 toward the center of the main passage 22, and has a wide front surface 221 and a back surface, and an upstream end surface 223 and a downstream end surface 224 which are a pair of narrow side surfaces. The measurement unit 213 is inserted inward from the mounting hole provided in the main passage 22, and is fixed to the main passage 22 via the flange 211, for example, by bringing the flange 211 into contact with the main passage 22 and fixing the flange 211 to the main passage 22 with a screw.

The measurement unit 213 protrudes from an inner wall of the main passage 22 toward a central axis 22a of the main passage 22 in a state where the physical quantity measurement device 20 is attached to the main passage 22. Then, the front surface 221 and the back surface are arranged in parallel along the central axis 22a of the main passage 22, and of the narrow upstream end surface 223 and the downstream end surface 224 of the measurement unit 213, the upstream end surface 223 on one side of the measurement unit 213 in a lateral direction is disposed to face the upstream side of the main passage 22, and the downstream end surface 224 on the other side of the measurement unit 213 in the lateral direction is disposed to face the downstream side of the main passage 22.

The front surface 221 of the measurement unit 213 is flat from the upstream end surface 223 to the downstream end surface 224 along the lateral direction. On the other hand, the back surface of the measurement unit 213 has a corner on the downstream end surface 224 side chamfered thereon, and is inclined in a direction gradually approaching the front surface as it moves from an intermediate position in the lateral direction to the downstream end surface 224. As a result, a cross-sectional shape of the measurement unit 213 is so-called streamline. Therefore, the measured gas 2 flowing from the upstream of the main passage 22 can be smoothly introduced into the downstream along the front surface 221 and the back surface of the measurement unit 213, and a fluid resistance of the measurement unit 213 against the measured gas 2 can be reduced.

The measurement unit 213 has a lower surface 226 on the upstream side of the main passage 22 and a lower surface 227 on the downstream side of the main passage 22 in a state where an end in a protruding direction is formed in a stepped shape and the physical quantity measurement device 20 is attached to the main passage 22. In the measurement unit 213, the lower surface 227 on the downstream side protrudes in the protruding direction from the lower surface 226 on the upstream side, and a stepped surface 228 connecting the lower surface 226 on the upstream side and the lower surface 227 on the downstream side is disposed to face the upstream side of the main passage 22.

In addition, in the measurement unit 213, an inlet 231 for taking a part of the measured gas 2 such as the intake air into a sub-passage in the measurement unit 213 is opened on the stepped surface 228 of a tip portion 213a which is on an opposite side to the flange 211 and protrudes from the lower surface 226 on the upstream side. Then, a first outlet 232 and a second outlet 233 for returning the measured gas 2 taken into the sub-passage in the measurement unit 213 to the main passage 22 are opened on the downstream end surface 224 of the tip portion 213a of the measurement unit 213.

That is, the measurement unit 213 has an upstream end surface 223 as a first wall portion disposed toward the upstream side in the flow direction of the measured gas 2 of the main passage 22. In addition, the measurement unit 213 has the stepped surface 228 of the tip portion 213a as a second wall portion which is located on the downstream side in the flow direction of the measured gas 2 in the main passage 22 from the upstream end surface 223 as the first wall portion and disposed toward the upstream side in the flow direction of the measured gas 2. An inlet 231 of the sub-passage is opened on the stepped surface 228 of this tip portion 213a.

Since the inlet 231 of the sub-passage is provided in the tip portion 213a of the measurement unit 213 extending from the flange 211 toward the center of the main passage 22, the physical quantity measurement device 20 can take a gas of a portion in the vicinity of a center away from an inner wall surface of the main passage 22 into the sub-passage, not the vicinity of the inner wall surface of the main passage 22. Therefore, the physical quantity measurement device 20 can measure the flow rate of gas in the portion away from the inner wall surface of the main passage 22, and can suppress the decrease in the measurement accuracy due to the influence of heat or the like.

Near the inner wall surface of the main passage 22, the temperature of the main passage 22 is easily affected, and the temperature of the measured gas 2 differs from the original temperature of gas, which is different from the average state of the main gas in the main passage 22. In particular, when the main passage 22 is the intake body of the engine, it is often maintained at a high temperature due to the influence of heat from the engine. For this reason, the gas in the vicinity of the inner wall surface of the main passage 22 is often higher than the original temperature of the main passage 22, which is a factor of causing the decrease in the measurement accuracy. In addition, the fluid resistance is large in the vicinity of the inner wall surface of the main passage 22, and a flow velocity is lower than the average flow velocity of the main passage 22. Therefore, when the gas in the vicinity of the inner wall surface of the main passage 22 is taken into the sub-passage as the measured gas 2, the decrease in the flow velocity with respect to the average flow velocity of the main passage 22 may lead to a measurement error.

Since the physical quantity measurement device 20 has an inlet 231 provided in the tip portion 213a of the thin and long measurement unit 213 extending from the flange 211 toward the center of the main passage 22, the measurement error related to the decrease in the flow velocity in the vicinity of the inner wall surface of the main passage 22 can be reduced. Further, in the physical quantity measurement device 20, the inlet 231 is not only provided in the tip portion 213a of the measurement unit 213 extending from the flange 211 toward the center of the main passage 22, but the first outlet 232 and the second outlet 233 of the sub-passage are also provided in the tip portion 213a of the measurement unit 213, so it is possible to further reduce the measurement error.

In the physical quantity measurement device 20, the measurement unit 213 has a shape that extends long along the axis from the outer wall of the main passage 22 toward the center, but the width of the upstream end surface 223 and the downstream end surface 224 is narrower than the width of the front surface 221, and the measurement unit 213 has a plate-like shape. As a result, the physical quantity measurement device 20 can suppress the fluid resistance against the measured gas 2 to a small value.

The measurement unit 213 is provided with a sub-passage groove 250 for forming a sub-passage 234 and a circuit chamber 235 for accommodating a circuit board 207. The circuit chamber 235 and the sub-passage groove 250 are recessed in the front surface of the measurement unit 213, and are disposed separately on one side and the other side of the measurement unit 213 in the lateral direction. The circuit chamber 235 is disposed on the upstream side in the flow direction of the measured gas 2 in the main passage 22, and the sub-passage 234 is disposed on the downstream side in the flow direction of the measured gas 2 in the main passage 22 from the circuit chamber 235. Note that in the flow direction of the measured gas 2 in the main passage 22, a space can be saved by setting the surface on the upstream side of the wall portion on the upstream side of the circuit chamber 235 as the upstream end surface 223 of the measurement unit 213.

The sub-passage groove 250 forms the sub-passage 234 in cooperation with the cover 202. The sub-passage 234 extends along the longitudinal direction of the measurement unit 213, which is the protruding direction of the measurement unit 213. The sub-passage groove 250 forming the sub-passage 234 has a first sub-passage groove 251 and a second sub-passage groove 252 branching in the middle of the first sub-passage groove 251.

The first sub-passage groove 251 is formed to extend along the lateral direction of the measurement unit 213 between the inlet 231 that is opened on the stepped surface 228 of the tip portion 213a of the measurement unit 213 and the first outlet 232 that is opened on the downstream end surface 224 of the tip portion 213a of the measurement unit 213. The inlet 231 is opened so as to face the upstream side in the flow direction of the measured gas 2 in the main passage 22. In the first sub-passage groove 251, a first sub-passage 234a, which extends from the inlet 231 along the central axis 22a of the main passage 22 and reaches the first outlet 232, is formed in the cover 202.

The first sub-passage 234a takes the measured gas 2 flowing in the main passage 22 from the inlet 231 and returns the taken measured gas 2 from the first outlet 232 to the main passage 22. The first sub-passage 234a extends from the inlet 231 along the flow direction of the measured gas 2 in the main passage 22 and is connected to the first outlet 232. The first sub-passage 234a has a branch portion 236 between the inlet 231 and the first outlet 232.

The branch portion 236 is provided in the vicinity of the inlet 231 on the upstream side of the measured gas 2 at the time of a forward flow in the first sub-passage 234a extending along the central axis 22a of the main passage 22. As illustrated in FIG. 1, the measured gas 2 flows from the air cleaner 21 toward the internal combustion engine 10 along the central axis 22a of the main passage 22 at the time of the forward flow. At the time of the forward flow, the measured gas 2 flowing through the main passage 22 is taken into the first sub-passage 234a from the inlet 231 and flows toward the first outlet 232 in the first sub-passage 234a, and flows into the second sub-passage 234b from the branch portion 236.

The second sub-passage groove 252 branches toward a base end portion of the measurement unit 213, that is, the flange 211, at an intermediate position of the first sub-passage groove 251 and extends in the longitudinal direction of the measurement unit 213, that is, in the direction intersecting the central axis 22a of the main passage 22, for example, in the direction substantially orthogonal to the central axis 22a.

Further, the second sub-passage groove 252 extends in a direction curved and folded back toward the tip portion 213a in the vicinity of the flange 211 of the measurement unit 213, for example, in a U-shape or an arc shape, and a direction intersecting the longitudinal direction of the measurement unit 213, that is, the central axis 22a of the main passage 22, for example, a direction substantially orthogonal to the central axis 22a.

The second sub-passage groove 252 is finally bent toward the downstream end surface 224 of the measurement unit 213 so as to be curved, for example, in an arc shape, and is connected to the second outlet 233. The second outlet 233 is opened so as to face the downstream side in the flow direction of the measured gas 2 in the main passage 22. The second outlet 233 has an opening area substantially equal to or slightly larger than that of the first outlet 232, and is formed at a position adjacent to the base end portion of the measurement unit 213 in the longitudinal direction from the first outlet 232.

In the second sub-passage groove 252, the second sub-passage 234b, which branches from the first sub-passage 234a toward the flange 211 and reaches the second outlet 233, is formed in the cover 202.

The second sub-passage 234b makes the measured gas 2, which branches from the first sub-passage 234a and flows in, pass therethrough and returns the measured gas 2 from the second outlet 233 to the main passage 22. The second sub-passage 234b has a reciprocating route along the longitudinal direction of measurement unit 213. More specifically, the second sub-passage 234b has, for example, a linear upstream portion 237, an arc-shaped or U-shaped curved portion 238, and a linear downstream portion 239.

The upstream portion 237 branches, for example, from the branch portion 236 of the first sub-passage 234a and extends substantially linearly in the direction intersecting the central axis 22a of the main passage 22. The upstream portion 237 extends, for example, in a direction substantially orthogonal to the central axis 22a of the main passage 22, that is, in a direction extending from the branch portion 236 of the first sub-passage 234a toward the flange 211.

The curved portion 238 is connected to, for example, a downstream end portion of the upstream portion 237 in the vicinity of the flange 211, and is curved so as to fold back toward the central axis 22a of the main passage 22. The curved portion 238 has, for example, an arc shape or a U shape, and is curved so as to fold the second sub-passage 234b by 180° in a reverse direction.

The downstream portion 239 is connected to, for example, the downstream end portion of the curved portion 238 in the vicinity of the flange 211 and extends substantially linearly toward the central axis 22a of the main passage 22. The downstream portion 239 extends toward, for example, the tip portion 213a of the measurement unit 213 substantially parallel to the upstream portion 237, and extends toward the downstream side from the branch portion 236 in the first sub-passage 234a. The downstream portion 239 is connected to the second outlet 233 by being curved in the direction along the central axis 22a of the main passage 22 in the vicinity of the second outlet 233 of the tip portion 213a.

The second sub-passage 234b has a curved shape. More specifically, the upstream portion 237 of the second sub-passage 234b branches from the branch portion 236 of the first sub-passage 234a and extends in the direction intersecting the central axis 22a of the main passage 22. The curved portion 238 of the second sub-passage 234b is curved so as to fold back from the upstream portion 237 toward the central axis 22a of the main passage 22. The downstream portion 239 of the second sub-passage 234b extends from the curved portion 238 toward the central axis 22a of the main passage 22. The curved shape of the second sub-passage 234b is formed by the upstream portion 237, the curved portion 238, and the downstream portion 239.

Although not illustrated, for example, the second outlet 233 is omitted, the downstream portion 239 of the second sub-passage 234b is connected to the downstream side from the branch portion 236 of the first sub-passage 234a, and the second sub-passage 234b may be joined to the first sub-passage 234a.

In the second sub-passage 234b, for example, the flow rate sensor 205 is disposed in the upstream portion 237.

More specifically, in the upstream portion 237 of the second sub-passage 234b, the flow rate sensor 205 is disposed in an intermediate portion between the first sub-passage 234a and the curved portion 238. By having the curved shape as described above, the second sub-passage 234b can secure a longer passage length, and when a pulsation occurs in the measured gas 2 in the main passage 22, the influence on the flow rate sensor 205 can be reduced.

According to the above configuration, the sub-passage 234 can be formed along the longitudinal direction which is the protruding direction of the measurement unit 213, and the length of the sub-passage 234 can be secured sufficiently long. As a result, the physical quantity measurement device 20 can be provided with the sub-passage 234 having a sufficient length. Therefore, the physical quantity measurement device 20 can suppress the fluid resistance to a small value and can measure the physical quantity of the measured gas 2 with high accuracy.

Since the first sub-passage 234a extends from the inlet 231 along the lateral direction of the measurement unit 213, that is, the central axis 22a of the main passage 22, and reaches the first outlet 232, foreign matters such as dust that penetrates into the first sub-passage 234a from the inlet 231 can be discharged from the first outlet 232 as they are. As a result, it is possible to suppress the foreign matters from penetrating into the second sub-passage 234b and suppress the influence on the flow rate sensor 205 disposed in the second sub-passage 234b.

In the inlet 231 and the first outlet 232 of the first sub-passage 234a, an opening area of the inlet 231 is larger than that of the first outlet 232. By making the opening area of the inlet 231 larger than that of the first outlet 232, the measured gas 2 that has flowed into the first sub-passage 234a can be reliably guided to the second sub-passage 234b that branches in the middle of the first sub-passage 234a.

In the vicinity of the inlet 231 of the first sub-passage groove 251, a protrusion 253 is provided at the central position of the inlet 231 in the longitudinal direction of the measurement unit 213. The protrusion 253 bisects the size of the inlet 231 in the longitudinal direction of the measurement unit 213, and makes the opening areas of each of the bisected inlets 231 smaller than the opening areas of the first outlet 232 and the second outlet 233. The protrusion 253 can restrict a size of foreign matters that can penetrate into the first sub-passage 234a from the inlet 231 to be smaller than that of the first outlet 232 and the second outlet 233, and prevent the first outlet 232 or the second outlet 233 from being blocked by the foreign matters.

The circuit board 207 is housed in the circuit chamber 235 provided on one side of the measurement unit 213 in the lateral direction. The circuit board 207 has a rectangular shape extending along the longitudinal direction of the measurement unit 213, and has a chip package 208, a pressure sensor 204, a temperature/humidity sensor 206, and an intake air temperature sensor 203 mounted on the surface thereof. The circuit board 207 has a mounting portion common to all sensors, and can be commonly used for mounting patterns of various sensors. The surface of the circuit board 207 is disposed substantially parallel to the measured gas 2 flowing through, for example, the main passage 22. This makes it possible to reduce the thickness of the measurement unit 213 and reduce the pressure loss of the measured gas 2 flowing through the main passage 22.

The chip package 208 is mounted on the circuit board 207. The chip package 208 is mounted with, for example, the flow rate sensor 205 and LSI which is an electronic component for driving the flow rate sensor 205, and sealed by a transfer mold. The electronic components mounted on the chip package 208 constitute the signal processing unit 260 that processes an output signal of the flow rate sensor 205. The chip package 208 is mounted in a state where a part of the chip package 208 protrudes from the circuit board 207 into the second sub-passage 234b at the center position in the longitudinal direction of the circuit board 207 so that the flow rate sensor 205 is disposed in the second sub-passage 234b.

The chip package 208 is disposed between the sub-passage 234 and the circuit chamber 235. As a result, the circuit chamber 235 and the sub-passage 234 are separated, and the flow in the flow rate sensor 205 disposed in the chip package 208 is rate-determined by the shape of the sub-passage 234. Therefore, the sub-passage 234 has no barrier that obstructs the flow of the measured gas 2, and the stable flow of the measured gas 2 can be supplied to the flow rate sensor 205. Therefore, it is possible to miniaturize the measurement unit 213 while maintaining flow velocity sensitivity, noise performance, and pulsation characteristics of the flow rate sensor.

Note that the flow rate sensor 205 does not necessarily have to be provided in the chip package 208. For example, the flow rate sensor 205 may be disposed on the sub-passage 234 by protruding a part of the circuit board 207, or the flow rate sensor 205 mounted on the circuit board 207 may be disposed on the sub-passage 234 by a plate-like support.

The flow rate sensor 205 and the LSI may be integrally formed on the same semiconductor element or may be formed as different semiconductor elements. The flow rate sensor 205 is sealed with a resin so that the flow rate measurement unit on the surface thereof is at least exposed. Although the structure in which the LSI is provided in the chip package 208 has been described, the structure in which the LSI is mounted on the circuit board 207 may be used. The advantage of providing the LSI in the chip package 208 is that it is not necessary to mount the LSI on the circuit board 207, which contributes to the miniaturization of the circuit board 207.

The chip package 208 has a recessed groove extending along the flow direction of the measured gas 2 on the upstream portion of the second sub-passage 234b, and a bottom of the recessed groove is provided with the flow rate sensor 205. The recessed groove of the chip package 208 has a squeezing shape in which the width gradually narrows from both end portions to the center in the flow direction of the measured gas 2 that flows along the upstream portion of the second sub-passage 234b, and the flow rate sensor 205 is disposed in the narrowest center. Due to this squeezing shape, the measured gas 2 flowing through the sub-passage 234 is rectified, and the influence of noise can be reduced.

The pressure sensor 204 is mounted on the base end portion side of the circuit board 207 in the longitudinal direction from the chip package 208, and the temperature/humidity sensor 206 is mounted on a tip side of the circuit board 207 in the longitudinal direction from the chip package 208. A lead of the intake air temperature sensor 203 is connected to the surface of the circuit board 207. The intake air temperature sensor 203 is mounted so that the lead of the intake air temperature sensor 203 is connected to the position of the tip side of the circuit board 207 in the longitudinal direction from the temperature/humidity sensor 206, and the sensor body 203b is disposed at a position exposed to the outside of the measurement unit 213 so as to protrude from the circuit board 207 in the longitudinal direction.

The intake air temperature sensor 203 is disposed between the upstream end surface 223 on the flange 211 side of the measurement unit 213 and the stepped surface 228 of the tip portion 213a. The intake air temperature sensor 203 is mounted on the circuit board 207 and is provided to be exposed to the outside of the measurement unit 213. The intake air temperature sensor 203 is constituted by an axial lead component that has a columnar sensor body and a pair of leads protruding in directions away from each other at both end portions of the sensor body in the axial direction. The measurement unit 213 is provided with a protector 202a for protecting the intake air temperature sensor 203.

The measurement unit 213 has (1) the pressure sensor 204, (2) the flow rate sensor 205, (3) the temperature/humidity sensor 206, and (4) the intake air temperature sensor 203 in order from the base end portion side toward the tip portion side along the longitudinal direction thereof (toward the protruding direction of the measurement unit 213). The pressure sensor 204 measures the pressure of the measured gas 2, and the flow rate sensor 205 measures the flow rate of the measured gas 2. The temperature/humidity sensor 206 measures the humidity of the measured gas 2, and the intake air temperature sensor measures the temperature of the measured gas 2.

Figure 5:
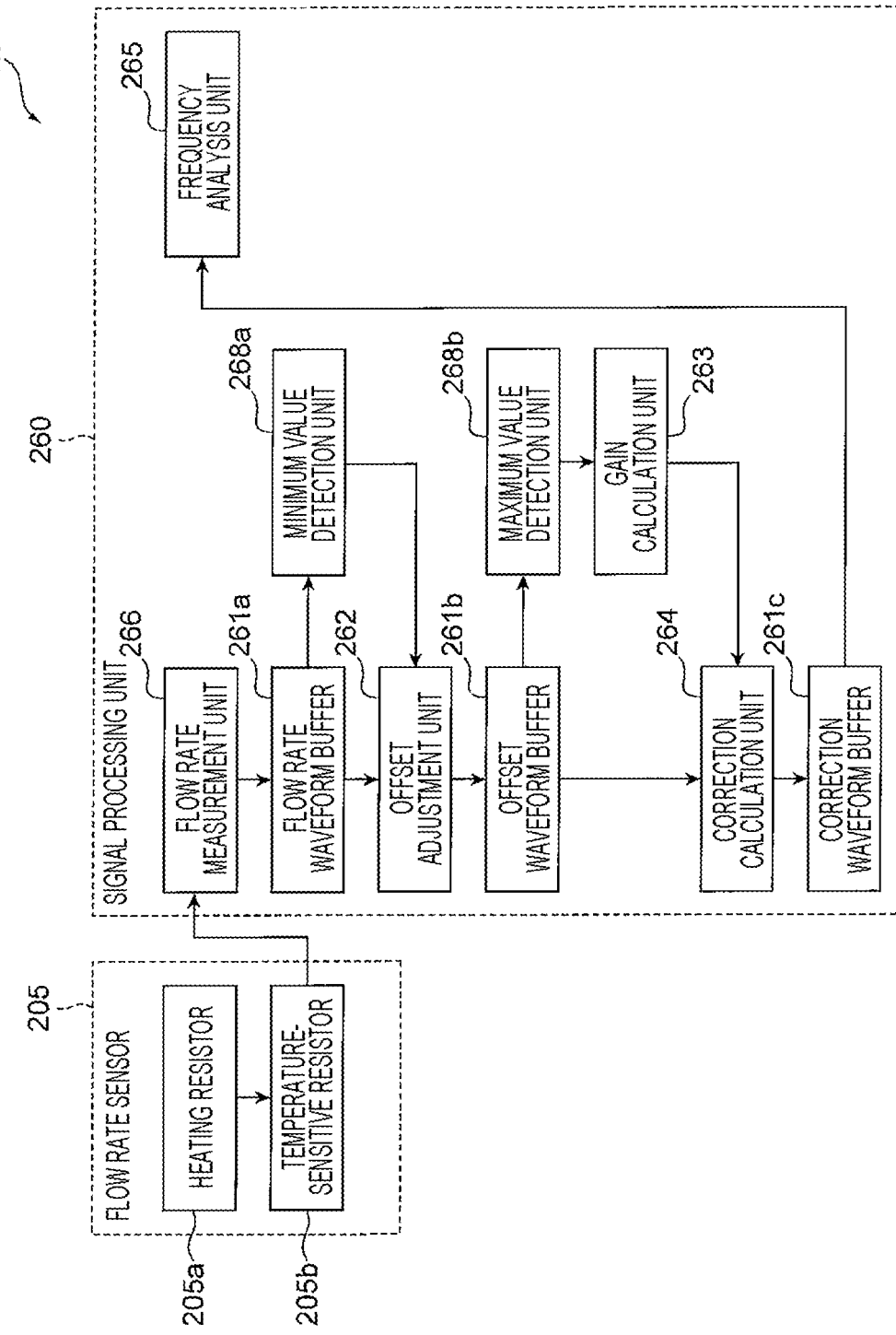
FIG. 5 is a block diagram illustrating a configuration of a part of the physical quantity measurement device according to a first embodiment.

FIG. 5 is a block diagram illustrating a configuration of a part of the physical quantity measurement device 20 according to a first embodiment of the present disclosure.

As described above, the physical quantity measurement device 20 includes a flow rate sensor 205 that outputs a signal corresponding to the flow rate of gas, and a signal processing unit 260 that processes an output signal of the flow rate sensor 205. Further, as described above, the signal processing unit 260 includes a buffer 261, an offset adjustment unit 262, a gain calculation unit 263, a correction calculation unit 264, and a frequency analysis unit 265. In the example illustrated in FIG. 5, the buffer 261 has a flow rate waveform buffer 261a, an offset waveform buffer 261b, and a correction waveform buffer 261c.

Further, in the example illustrated in FIG. 5, the flow rate sensor 205 has a heating resistor 205a and a temperature-sensitive resistor 205b, and the signal processing unit 260 has a flow rate measurement unit 266 as in the example illustrated in FIG. 2. Further, in the example illustrated in FIG. 5, the signal processing unit 260 has a minimum value detection unit 268a and a maximum value detection unit 268b. In the example illustrated in FIG. 5, a pulsation correction unit 267 and a flow rate output unit 270 illustrated in FIG. 2 are not illustrated.

As described above, the flow rate sensor 205 is mounted on the chip package 208 illustrated in FIG. 4, and is disposed, for example, in the upstream portion 237 of the sub-passage 234 provided in the measurement unit 213 of the housing 201 constituting the physical quantity measurement device 20. The flow rate sensor 205 has a pair of temperature-sensitive resistors 205b on both sides of the heating resistor 205a, for example, in the flow direction of the measured gas 2.

That is, the flow rate sensor 205 is a thermal type flow meter that measures the flow rate of gas based on the temperature difference between the pair of temperature-sensitive resistors 205b disposed on the upstream and downstream sides of the heating resistor 205a in the flow direction of the measured gas 2. In addition to the heating resistor 205a and the temperature-sensitive resistor 205b, the flow rate sensor 205 includes, for example, a plurality of fixed resistors (not illustrated), electrode pads for making an electrical connection with the outside, and the like.

As described above, the flow rate measurement unit 266 includes, for example, a voltage-flow rate conversion table based on the relationship between the voltage which is the output signal of the flow rate sensor 205 and the flow rate of the measured gas 2, and converts the output signal of the flow rate sensor 205 into the flow rate data of the measured gas 2. The flow rate measurement unit 266 is constituted by, for example, electronic components such as an arithmetic unit or a storage device mounted on the chip package 208, a program stored in the storage device, and the like.

The flow rate waveform buffer 261a stores, for example, the flow rate data of the measured gas 2 output from the flow rate measurement unit 266 for a predetermined period based on the output signal of the flow rate sensor 205 for a predetermined period. The flow rate waveform buffer 261a is constituted by, for example, a storage device such as a memory mounted on the chip package 208. The flow rate data stored in the flow rate waveform buffer 261a is, for example, overwritten with new flow rate data output from the flow rate measurement unit 266 sequentially with the passage of time.

For example, the minimum value detection unit 268a calculates the minimum value of the flow rate waveform in a graph in which a vertical axis is a flow rate and a horizontal axis is a time, based on the flow rate data stored in the flow rate waveform buffer 261a for a predetermined period. The minimum value detection unit 268a is constituted by, for example, electronic components such as an arithmetic unit or a storage device mounted on the chip package 208, a program stored in the storage device, and the like.

The offset adjustment unit 262 adjusts a zero point of a flow rate waveform based on the flow rate data stored in the buffer 261. In the example illustrated in FIG. 5, the offset adjustment unit 262 sets the minimum value of the flow rate waveform output from the minimum value detection unit 268a to the zero point of the flow rate waveform, and adjusts the zero point of the flow rate waveform. The offset adjustment unit 262 is constituted by, for example, electronic components such as an arithmetic unit or a storage device mounted on the chip package 208, a program stored in the storage device, and the like.

The offset waveform buffer 261b stores the flow rate data of the flow rate waveform whose zero point has been adjusted by the offset adjustment unit 262. The offset waveform buffer 261b is constituted by, for example, the storage device such as the memory mounted on the chip package 208.

The maximum value detection unit 268b detects the maximum value of the flow rate waveform after the zero point adjustment (offset) stored in the offset waveform buffer 261b after the zero point is adjusted by the offset adjustment unit 262. Here, the maximum value of the flow rate waveform is, for example, the maximum value among a plurality of maximum values of the offset flow rate waveform. The maximum value detection unit 268b is constituted by, for example, electronic components such as an arithmetic unit or a storage device mounted on the chip package 208, a program stored in the storage device, and the like.

The gain calculation unit 263 calculates a correction gain to be multiplied by the flow rate waveform whose zero point has been adjusted. The gain calculation unit 263 calculates, as the correction gain, a gain at which the frequency analysis unit 265 does not cause an overflow. Here, the overflow is an arithmetic overflow, and means that the numerical type exceeds the upper limit of the value that can be expressed in the calculation of the computer, and the error caused by the overflow. The overflow is sometimes referred to as "digit overflow." The gain calculation unit 263 is constituted by, for example, electronic components such as an arithmetic unit or a storage device mounted on the chip package 208, a program stored in the storage device, and the like.

For example, the gain calculation unit 263 stores, as a limit value, a maximum value at which the overflow does not occur in the frequency analysis unit 265 which stores the transient data of the frequency analysis calculation or the calculation results. That is, when the maximum value of the flow rate waveform on which the frequency analysis calculation is performed exceeds this limit value, the overflow occurs in the frequency analysis unit 265. For example, the gain calculation unit 263 compares the limit value with the maximum value of the offset flow rate waveform. Then, the gain calculation unit 263 calculates the correction gain so that the maximum value of the corrected flow rate waveform obtained by multiplying the offset flow rate waveform by the correction gain becomes equal to or less than the above limit value. The gain calculation unit 263 may calculate, for example, the correction gain so that the maximum value of the flow rate waveform obtained by multiplying the offset flow rate waveform by the correction gain is equal to the limit value at which the overflow does not occur in the frequency analysis unit 265.

The correction calculation unit 264 multiplies the flow rate waveform by the correction gain calculated by the gain calculation unit 263 to correct the flow rate waveform whose zero point has been adjusted by the offset adjustment unit 262. More specifically, the correction calculation unit 264 reads the offset flow rate waveform from the offset waveform buffer 261b, and multiplies the correction gain output from the gain calculation unit 263 by the offset flow rate waveform to calculate the offset flow rate waveform data. The correction calculation unit 264 is constituted by, for example, electronic components such as an arithmetic unit or a storage device mounted on the chip package 208, a program stored in the storage device, and the like.

The correction waveform buffer 261c stores the flow rate data of the corrected flow rate waveform obtained by multiplying the flow rate waveform after the zero point adjustment, that is, the offset flow rate waveform by the offset adjustment unit 262 by the correction gain by the correction calculation unit 264. The flow rate of the maximum value of the corrected flow rate waveform is equal to or less than the limit value at which the overflow does not occur in the frequency analysis unit 265 in the frequency analysis calculation of the frequency analysis unit 265.

The frequency analysis unit 265 reads the corrected flow rate waveform from the correction waveform buffer 261c, and performs the frequency analysis calculation of the corrected flow rate waveform. Further, for example, as illustrated in FIG. 2, the frequency analysis unit 265 stores data obtained by the calculation, such as transient data in the middle of the calculation or the calculation results. Further, the frequency analysis unit 265 stores the calculation results of the frequency analysis calculation in the buffer 261. The frequency analysis unit 265 is constituted by, for example, electronic components such as an arithmetic unit or a storage device mounted on the chip package 208, a program stored in the storage device, and the like.

Although omitted in FIG. 5, the pulsation correction unit 267 reads the result of the frequency analysis calculation by the frequency analysis unit 265 from the buffer 261 as illustrated in FIG. 2, for example. Further, the pulsation correction unit 267 reads, for example, the flow rate waveform output from the flow rate measurement unit 266 and stored in the flow rate waveform buffer 261a of the buffer 261. Then, the flow rate waveform based on the output signal of the flow rate sensor 205 is corrected based on the result of the frequency analysis calculation by the frequency analysis unit 265.

Further, although omitted in FIG. 5, as described above, the flow rate output unit 270 outputs the flow rate data of the measured gas 2, whose pulsation is corrected, output from the pulsation correction unit 267 to the outside of the physical quantity measurement device 20 via the external terminal of the connector 212. The flow rate output unit 270 is constituted by, for example, electronic components such as an arithmetic unit or a storage device mounted on the chip package 208, the program stored in the storage device, the output terminal, and the like.

Hereinafter, the operation of the physical quantity measurement device 20 of the present embodiment will be described with reference to FIG. 6.

Figure 6A:
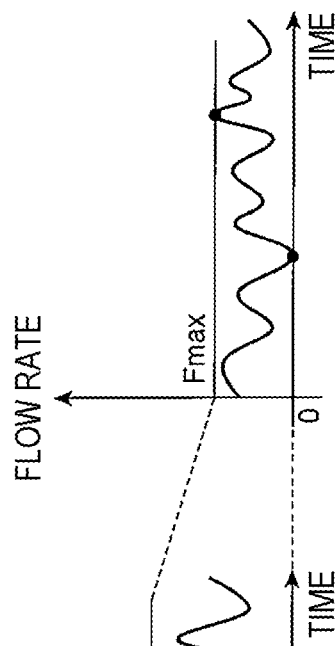
FIGS. 6A-6C constitute a graph illustrating a process by a signal processing unit of the physical quantity measurement device illustrated in FIG. 5.
Figure 6B:
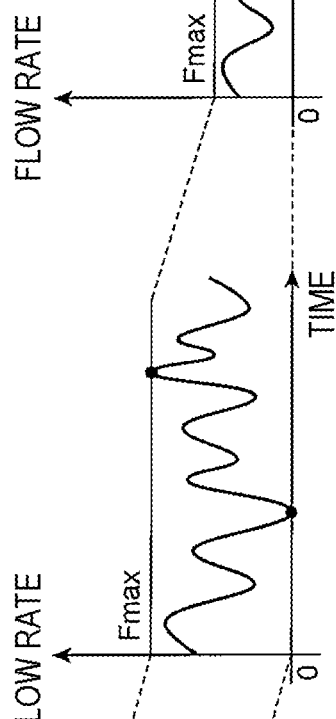
Figure 6C:
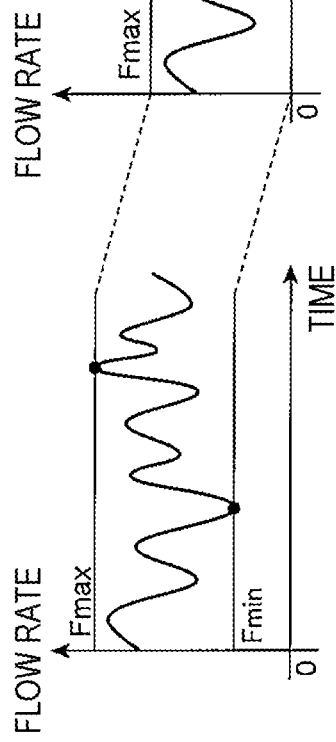

FIG. 6 are graphs (A) to (C) illustrating a process by the signal processing unit 260 of the physical quantity measurement device 20 illustrated in FIG. 5. The vertical axis of each graph is the flow rate, and the horizontal axis thereof is the time. The graphs (A) to (C) are a graph of the flow rate waveform whose zero point is not adjusted, a graph of the flow rate waveform whose zero point is adjusted, and a graph of the flow rate waveform after the multiplication by the correction gain, respectively.

As described above, the physical quantity measurement device 20 is disposed in the intake body which is the main passage 22 through which the measured gas 2 which is the intake air sucked from the air cleaner 21 of the internal combustion engine control system 1 of the electronic fuel injection type flows. The physical quantity measurement device 20 measures the physical quantity including the flow rate of the measured gas 2 flowing through the main passage 22, and outputs the measured physical quantity to the control device 4.

As described above, the physical quantity measurement device 20 includes a flow rate sensor 205 that outputs a signal corresponding to the flow rate of the measured gas 2, and a signal processing unit 260 that processes an output signal of the flow rate sensor 205. The signal processing unit 260 includes a buffer 261, an offset adjustment unit 262, a gain calculation unit 263, a correction calculation unit 264, and a frequency analysis unit 265. The buffer 261 stores the flow rate data of the measured gas 2 based on the output signal of the flow rate sensor 205 for a predetermined period.

The offset adjustment unit 262 adjusts a zero point of a flow rate waveform based on the flow rate data stored in the buffer 261. The gain calculation unit 263 calculates the correction gain of the flow rate waveform whose zero point has been adjusted. The correction calculation unit 264 performs the correction by multiplying the correction gain by the flow rate waveform whose zero point has been adjusted. The frequency analysis unit 265 performs a frequency analysis calculation of the corrected flow rate waveform and stores the data obtained by the calculation in the buffer 261. Then, the gain calculation unit 263 calculates, as the correction gain, a gain at which the frequency analysis unit 265 does not cause an overflow.

With this configuration, the flow rate waveform as shown in the graph (A) of FIG. 6 can be obtained based on the output signal of the flow rate sensor 205. Further, by performing the zero point adjustment of the flow rate waveform by the offset adjustment unit 262, it is possible to obtain the offset flow rate waveform as shown in the graph (B) of FIG. 6. Further, the gain calculation unit 263 can calculate the correction gain that does not cause an overflow during the frequency analysis calculation by the frequency analysis unit 265. Further, by multiplying the correction gain by the flow rate waveform offset by the correction calculation unit 264, the corrected flow rate waveform as shown in the graph (C) of FIG. 6 can be obtained. Further, the frequency analysis unit 265 can perform the frequency analysis calculation on the corrected flow rate waveform to prevent the frequency analysis unit 265 from overflowing.

In addition, by the above configuration, even when the amplitude of the flow rate waveform whose zero point is adjusted by the offset adjustment unit 262 is relatively large, it is possible to suppress the deterioration in the amplitude information by preventing the corrected flow rate waveform after the multiplication by the correction gain from being extremely reduced. On the other hand, when the amplitude of the flow rate waveform based on the output signal of the flow rate sensor 205 is relatively small, it is possible to enlarge the amplitude information of the flow rate waveform by multiplying the correction gain by the flow rate waveform whose zero point is adjusted. Therefore, according to the present embodiment, it is possible to provide the physical quantity measurement device 20 capable of improving the accuracy of the frequency analysis result of the flow rate waveform and reducing the frequency analysis error of the gas flow rate, regardless of the pulsation state of the flow rate waveform.

Further, in the physical quantity measurement device 20 of the present embodiment, as described above, the signal processing unit 260 stores the flow rate data of gas based on the output signal of the flow rate sensor 205 for a predetermined period in the buffer 261 including the flow rate waveform buffer 261a. Based on this flow rate data, the signal processing unit 260 can obtain, for example, the flow rate waveform as shown in the graph (A). Further, the signal processing unit 260 has the minimum value detection unit 268a for detecting a minimum value Fmin of the flow rate waveform. The offset adjustment unit 262 is configured to set this minimum value Fmin to the zero point of the flow rate waveform, as shown in the graph (B).

With this configuration, for example, by performing the zero point adjustment that adjusts the zero point to the minimum value Fmin of the flow rate waveform as shown in the graph (A), it is possible to obtain the offset flow rate waveform shown in the graph (B). As a result, the frequency analysis by the frequency analysis unit 265 can be performed on the flow rate data without sign.

Further, in the physical quantity measurement device 20 of the present embodiment, the signal processing unit 260 has a maximum value detection unit 268b for detecting a maximum value Fmax of the offset flow rate waveform in which the zero point shown in the graph (B) has been adjusted. Further, the gain calculation unit 263 calculates the correction gain so that the maximum value Fmax of the offset flow rate waveform is equal to or less than the limit value at which the frequency analysis unit 265 does not overflow due to the frequency analysis calculation of the frequency analysis unit 265.

With this configuration, as illustrated in the graph (B), it is possible to compare the maximum value Fmax of the flow rate waveform adjusted to the zero point by setting the minimum value Fmin of the flow rate waveform to the zero point with the limit value at which the overflow does not occur in the frequency analysis unit 265 during the frequency analysis calculation by the frequency analysis unit 265. As a result, the maximum value Fmax of the offset flow rate waveform shown in the graph (B) having the highest risk of causing the overflow in the frequency analysis unit 265 can be set to be equal to or less than the above limit value. Therefore, it is possible to more reliably prevent the overflow from occurring in the frequency analysis unit 265 during the frequency analysis calculation by the frequency analysis unit 265. Further, by the above configuration, the accuracy of the frequency analysis result of the flow rate waveform can be improved regardless of the pulsation state of the flow rate waveform.

More specifically, for example, as shown in the graph (B) of FIG. 6, the case is considered in which the maximum value Fmax of the offset flow rate waveform before the multiplication by the correction gain is equal to or greater than the limit value at which the overflow does not occur in the frequency analysis unit 265. In this case, as shown in the graph (C) of FIG. 6, it is possible to calculate the correction gain by the gain calculation unit 263 so that the maximum value Fmax of the flow rate waveform after the multiplication by the correction gain becomes a value as large as possible below the limit value at which overflow does not occur in the frequency analysis unit 265. As a result, it is possible to prevent the flow rate waveform after the multiplication by the correction gain from being extremely reduced, and to suppress the deterioration in the amplitude information.

Further, for example, as shown in the graph (B) of FIG. 6, the case is considered in which the maximum value Fmax of the offset flow rate waveform before the multiplication by the correction gain is smaller than the limit value at which the overflow does not occur in the frequency analysis unit 265. In this case, it is possible to calculate the correction gain by the gain calculation unit 263 so that the maximum value Fmax of the flow rate waveform after the multiplication by the correction gain becomes a value as large as possible below the limit value at which overflow does not occur in the frequency analysis unit 265. As a result, the flow rate waveform shown in the graph (B) of FIG. 6 can be enlarged as opposed to the reduced flow rate waveform shown in the graph (C) of FIG. 6, and the more detailed amplitude information of the flow rate waveform can be obtained.

In addition, in the physical quantity measurement device 20 according to the present embodiment, the buffer 261 has a flow rate waveform buffer 261a, an offset waveform buffer 261b, and a correction waveform buffer 261c. The flow rate waveform buffer 261a stores the flow rate data of gas based on the output signal of the flow rate sensor 205 for a predetermined period. The offset waveform buffer 261b stores the flow rate data of the flow rate waveform whose zero point has been adjusted. The correction waveform buffer 261c stores the flow rate data of the corrected flow rate waveform multiplied by the correction gain.

With this configuration, it is possible to reduce the risk of losing the data stored in each of the flow rate waveform buffer 261a, the offset waveform buffer 261b, and the correction waveform buffer 261c as compared with the case of using a single buffer 261. More specifically, when the frequency analysis process is performed in a shorter time than the time corresponding to the buffer length of the frequency analysis, it is possible to prevent the loss of the initial data and prevent multiple processes from being executed on a part of the analysis data.

As described above, according to one aspect of the present disclosure, it is possible to provide the physical quantity measurement device 20 capable of reducing the frequency analysis error of the gas flow rate.

Second Embodiment

Figure 7:
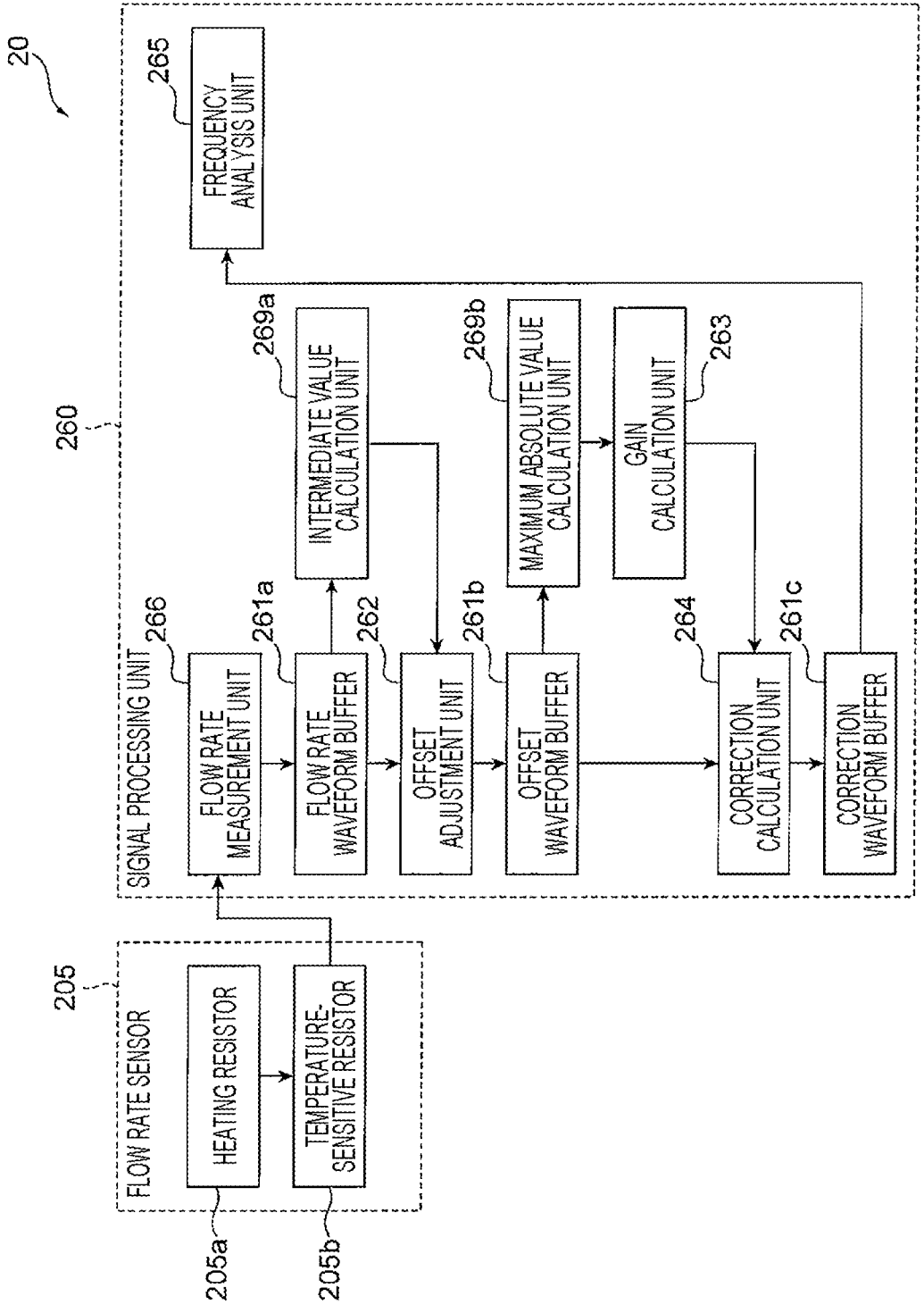
FIG. 7 is a block diagram illustrating a configuration of a part of the physical quantity measurement device according to a second embodiment.

FIG. 7 is a block diagram illustrating a configuration of a part of the physical quantity measurement device 20 according to a second embodiment of the present disclosure.

Figure 8:
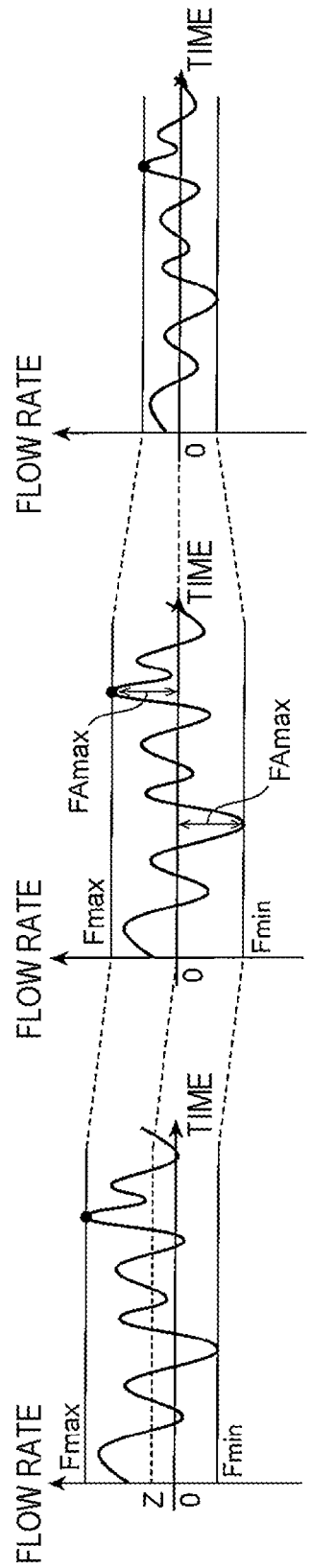
FIGS. 8A-8C constitute a graph for describing an example of a process by a signal processing unit of the physical quantity measurement device illustrated in FIG. 7.
Figure 9:
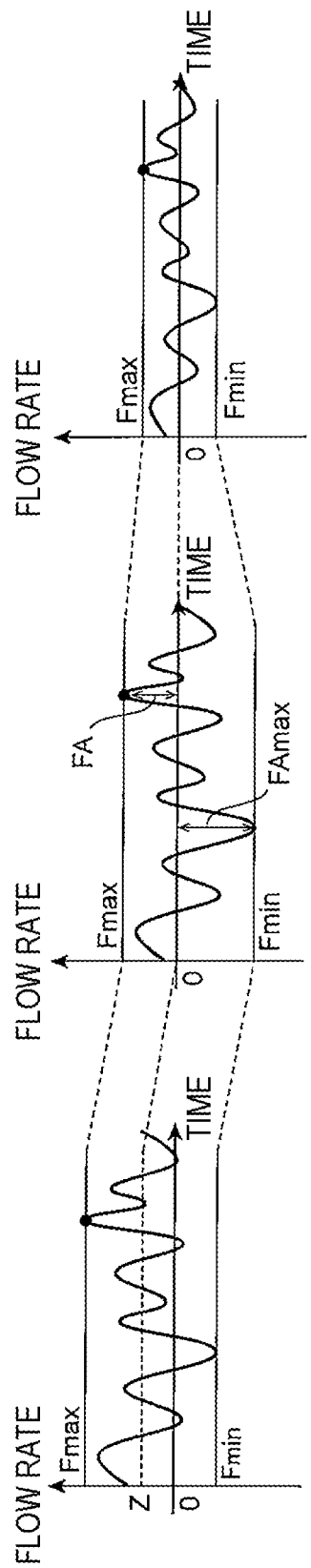
FIGS. 9A-9C constitute a graph for describing an example of a process by a signal processing unit of the physical quantity measurement device illustrated in FIG. 7.

FIG. 8 is a graph for describing an example of a process by the signal processing unit 260 of the physical quantity measurement device 20 illustrated in FIG. 7. FIG. 9 is a graph for describing another example of the process by the signal processing unit 260 of the physical quantity measurement device 20 illustrated in FIG. 7.

The physical quantity measurement device 20 according to the second embodiment is different from the physical quantity measurement device 20 according to the first embodiment illustrated in FIG. 5 in that it has an intermediate value calculation unit 269a and a maximum absolute value calculation unit 269b in place of the minimum value detection unit 268a and the maximum value detection unit 268b. Since other points of the physical quantity measurement device 20 according to the second embodiment are the same as those of the physical quantity measurement device 20 according to the first embodiment, the same reference numerals are given to the same parts and the description thereof will be omitted.

In the physical quantity measurement device 20 according to the second embodiment, as shown in the graphs (A) of FIGS. 8 and 9, the signal processing unit 260 has an intermediate value calculation unit 269a that calculates a zero point correction value Z between the maximum value Fmax and the minimum value Fmin of the flow rate waveform. Further, in the physical quantity measurement device 20 according to the second embodiment, the offset adjustment unit 262 sets the zero point correction value Z to the zero point of the flow rate waveform as shown in the graphs (B) of FIGS. 8 and 9. The intermediate value calculation unit 269a and the maximum absolute value calculation unit 269b are constituted by, for example, electronic components such as an arithmetic unit or a storage device mounted on the chip package 208, a program stored in the storage device, and the like.

With such a configuration, the frequency analysis of the flow rate waveform by the frequency analysis unit 265 can be performed on the flow rate data with a sign, and the same effect as that of the physical quantity measurement device 20 according to the first embodiment can be achieved.

Further, in the physical quantity measurement device 20 according to the second embodiment, the signal processing unit 260 has the maximum absolute value calculation unit 269b that calculates the maximum absolute value FAmax of the flow rate waveform whose zero point is adjusted as shown in the graphs (B) of FIGS. 8 and 9. Further, in the physical quantity measurement device 20 of the second embodiment, the gain calculation unit 263 calculates the correction gain so that the maximum absolute value FAmax of the flow rate waveform whose zero point is adjusted as shown in the graphs (B) of FIGS. 8 and 9 is equal to or less than the limit value at which the overflow does not occur in the frequency analysis unit 265 by the frequency analysis calculation of the frequency analysis unit 265.

Here, the maximum absolute value FAmax of the offset flow rate waveform whose zero point is adjusted as shown in the graphs (B) of FIGS. 8 and 9 is an absolute value FA of the flow rate at which the absolute value FA of the flow rate corresponding to the individual flow rate data of the offset flow rate waveform becomes the maximum in a predetermined period. More specifically, the maximum value detection unit 268b detects, for example, a plurality of maximum values and a plurality of minimum values of the offset flow rate waveform, and performs the calculation on the maximum value defined as the maximum absolute value FAmax among the absolute values FA of the flow rate having the detected maximum value and minimum value.

With such a configuration, it is possible to prevent the overflow from occurring in the frequency analysis unit 265 by performing the frequency analysis of the flow rate waveform by the frequency analysis unit 265 on the flow rate data with a sign, and achieve the same effect as that of the physical quantity measurement device 20 according to the first embodiment.

Further, in the physical quantity measurement device 20 according to the second embodiment, for example, as illustrated in FIG. 8, the intermediate value calculation unit 269a calculates the average value of the maximum value Fmax and the minimum value Fmin of the flow rate waveform as the zero point correction value Z of the flow rate waveform in the graph (A).

With this configuration, the correction gain calculated by the gain calculation unit 263 can be calculated based on the maximum absolute value FAmax of the maximum value Fmax and the minimum value Fmin of the flow rate waveform, which has a high risk of causing the overflow in the frequency analysis unit 265. Therefore, it is possible to more reliably prevent the overflow from occurring in the frequency analysis unit 265 by performing the frequency analysis of the flow rate waveform by the frequency analysis unit 265 on the flow rate data with sign.

Further, in the physical quantity measurement device 20 according to the second embodiment, for example, as illustrated in FIG. 9, the intermediate value calculation unit 269a calculates the average value of the flow rate waveform as the zero point correction value Z of the flow rate waveform in the graph (A).

With this configuration, the correction gain calculated by the gain calculation unit 263 can be calculated based on the maximum absolute value FAmax of the maximum value Fmax or the minimum value Fmin of the flow rate waveform, which has a high risk of causing the overflow in the frequency analysis unit 265. Therefore, it is possible to more reliably prevent the overflow from occurring in the frequency analysis unit 265 by performing the frequency analysis of the flow rate waveform by the frequency analysis unit 265 on the flow rate data with sign.

As described above, according to the second embodiment, similar to the first embodiment described above, it is possible to provide the physical quantity measurement device 20 capable of reducing the frequency analysis error of the gas flow rate.

Third Embodiment

Figure 10:
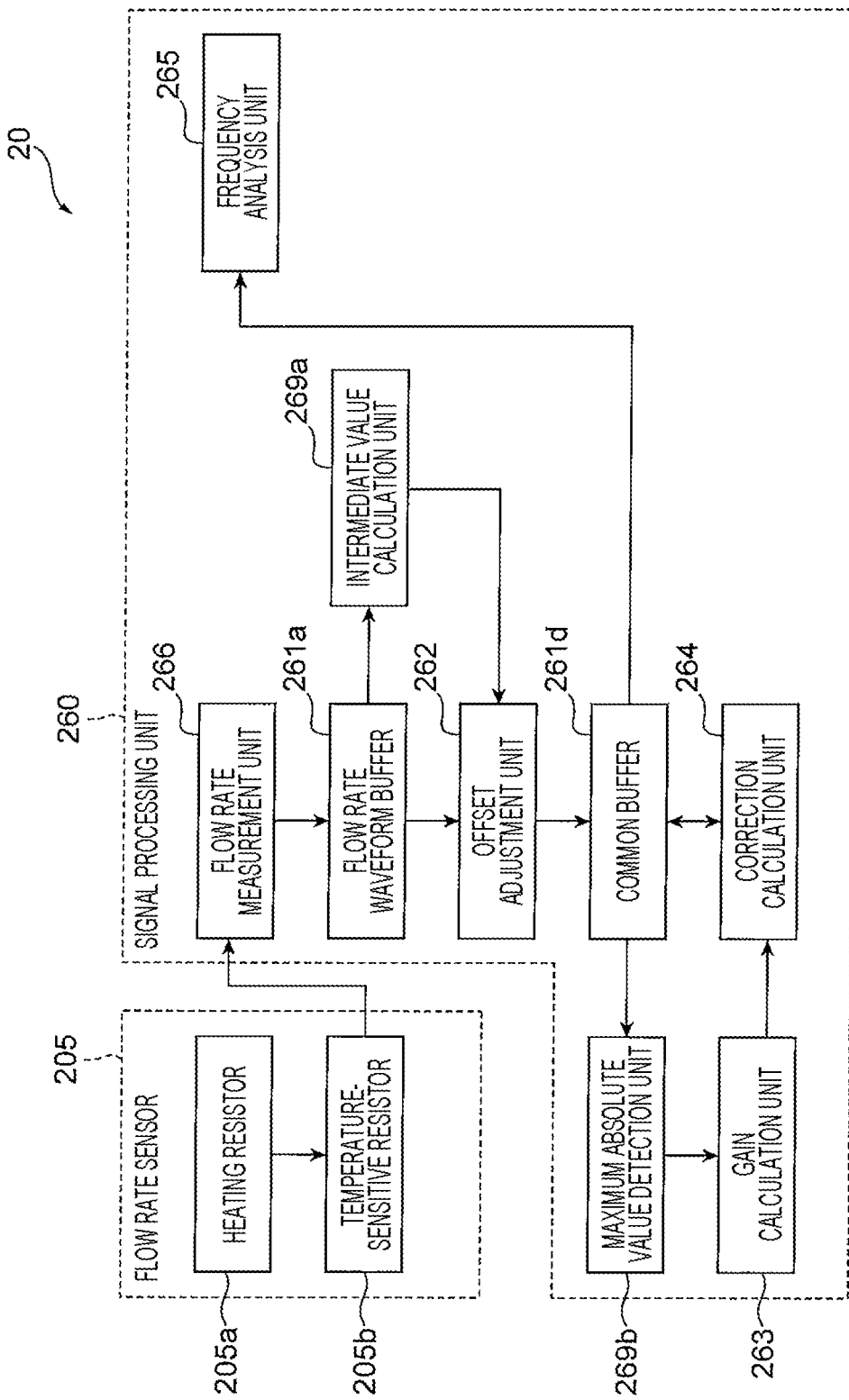
FIG. 10 is a block diagram illustrating a configuration of a part of the physical quantity measurement device according to a third embodiment.

FIG. 10 is a block diagram illustrating a configuration of a part of a physical quantity measurement device 20 according to a third embodiment of the present disclosure. The physical quantity measurement device 20 according to the third embodiment is different from the physical quantity measurement device 20 of the second embodiment illustrated in FIG. 7 in that the physical quantity measurement device 20 has a common buffer 261d instead of the offset waveform buffer 261b and the correction waveform buffer 261c. Since other points of the physical quantity measurement device 20 according to the third embodiment are the same as those of the physical quantity measurement device according to the second embodiment, the same reference numerals are given to the same parts and the description thereof will be omitted.

In the physical quantity measurement device 20 according to the third embodiment, the buffer 261 has a flow rate waveform buffer 261a and a common buffer 261d. As described above, the flow rate waveform buffer 261a stores the flow rate data of gas based on the output signal of the flow rate sensor 205 for a predetermined period. The common buffer 261d stores the flow rate data of the offset flow rate waveform whose zero point has been adjusted by the offset adjustment unit 262. Further, the common buffer 261d overwrites and stores the flow rate data of the corrected flow rate waveform obtained by multiplying the offset flow rate data by the correction gain by the correction calculation unit 264.

With this configuration, the same effect as that of the physical quantity measurement device 20 according to the second embodiment described above can not only be obtained, but also the configuration of the buffer 261 can be simplified and the cost of the physical quantity measurement device 20 can be reduced.

Although the embodiments of the physical quantity measurement device according to the present disclosure have been described in detail with reference to the drawings, the specific configuration is not limited to this embodiment, and even if there are design changes and the like in the range that does not deviate from the gist of this disclosure, these design changes are included in this disclosure.

REFERENCE SIGNS LIST 2 measured gas (gas)
20 physical quantity measurement device
205 flow rate sensor
260 signal processing unit
261 buffer
261a flow rate waveform buffer
261b offset waveform buffer
261c correction waveform buffer
261d common buffer
262 offset adjustment unit
263 gain calculation unit
264 correction calculation unit
265 frequency analysis unit
268a minimum value detection unit
268b maximum value detection unit
269a intermediate value calculation unit
269b maximum absolute value calculation unit
FAmax maximum absolute value
Fmin minimum value
Fmax maximum value
Z zero point correction value

The invention claimed is:

1. A physical quantity measurement device comprising a flow rate sensor that outputs a signal corresponding to a flow rate of a gas and a signal processing unit that processes an output signal of the flow rate sensor,
wherein the signal processing unit includes a buffer that stores flow rate data of the gas based on the output signal for a predetermined period, an offset adjustment unit that adjusts a zero point of a flow rate waveform based on the flow rate data stored in the buffer, a gain calculation unit that calculates a correction gain by which the flow rate waveform whose zero point has been adjusted is multiplied, a correction calculation unit that performs correction by multiplying the flow rate waveform whose zero point has been adjusted by the correction gain, and a frequency analysis unit that performs a frequency analysis calculation of the corrected flow rate waveform and stores the data obtained by the calculation in the buffer, and
the gain calculation unit calculates the correction gain that does not cause an overflow in the frequency analysis unit.

2. The physical quantity measurement device according to claim 1, wherein
the signal processing unit has a minimum value detection unit that detects a minimum value of the flow rate waveform, and
the offset adjustment unit sets the minimum value to a zero point of the flow rate waveform.

3. The physical quantity measurement device according to claim 2, wherein
the signal processing unit has a maximum value detection unit that detects the maximum value of the flow rate waveform whose zero point has been adjusted, and
the gain calculation unit calculates the correction gain so that the maximum value is equal to or less than a limit value at which an overflow does not occur in the frequency analysis unit by the frequency analysis calculation.

4. The physical quantity measurement device according to claim 1, wherein
the signal processing unit has an intermediate value calculation unit that calculates a zero point correction value between a maximum value and a minimum value of the flow rate waveform, and
the offset adjustment unit sets the zero point correction value to the zero point of the flow rate waveform.

5. The physical quantity measurement device according to claim 4, wherein the intermediate value calculation unit calculates an average value of the flow rate waveform as the zero point correction value.

6. The physical quantity measurement device according to claim 4, wherein the intermediate value calculation unit calculates an average value of the maximum value and the minimum value of the flow rate waveform as the zero point correction value.

7. The physical quantity measurement device according to claim 4, wherein
the signal processing unit has a maximum absolute value calculation unit that calculates a maximum absolute value of the flow rate waveform whose zero point has been adjusted, and
the gain calculation unit calculates the correction gain so that the maximum absolute value of the flow rate waveform whose zero point has been adjusted is equal to or less than the limit value at which the overflow does not occur in the frequency analysis unit by the frequency analysis calculation.

8. The physical quantity measurement device according to claim 1, wherein the buffer has a flow rate waveform buffer, an offset waveform buffer that stores flow rate data of the flow rate waveform whose zero point has been adjusted, and a correction waveform buffer that stores the flow rate data of the flow rate waveform obtained by multiplication of the correction gain.

9. The physical quantity measurement device according to claim 1, wherein the buffer has a common buffer that stores flow rate data of the flow rate waveform whose zero point has been adjusted, and overwrites and stores the flow rate data of the flow rate waveform obtained by multiplying the flow rate data by the correction gain.

* * * * *